US 6,554,954 B2
Apr. 29, 2003

(54) CONDUCTIVE COLLAR SURROUNDING SEMICONDUCTOR WORKPIECE IN PLASMA CHAMBER

(75) Inventors: Shawming Ma, Sunnyvale, CA (US); Ralph H M Straube, Sunnyvale, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/827,297

(22) Filed: Apr. 3, 2001

(65) Prior Publication Data

US 2002/0139478 A1 Oct. 3, 2002

(51) Int. Cl.$^7$ .................. H01L 21/3065; C23C 16/00
(52) U.S. Cl. ................. 156/345.51; 156/345.14; 156/345.29; 156/345.47; 118/728; 118/715; 118/723 E
(58) Field of Search ................. 118/728, 715, 118/723 E, 725, 729, 719, 723 R, 500, 720, 730

(56) References Cited

U.S. PATENT DOCUMENTS

| | | | | |
|---|---|---|---|---|
| 4,645,218 A | * | 2/1987 | Ooshio et al. ............... 279/128 |
| 5,271,788 A | | 12/1993 | Hasegawa et al. |
| 5,292,399 A | * | 3/1994 | Lee et al. ..................... 438/716 |
| 5,330,607 A | | 7/1994 | Nowicki |
| 5,411,624 A | * | 5/1995 | Hirano et al. ........... 156/345.46 |
| 5,535,507 A | * | 7/1996 | Barnes et al. ................. 29/825 |
| 5,556,500 A | * | 9/1996 | Hasegawa et al. ...... 156/345.27 |
| 5,561,585 A | * | 10/1996 | Barnes et al. ................ 361/234 |
| 5,573,596 A | | 11/1996 | Yin |
| 5,716,534 A | * | 2/1998 | Tsuchiya et al. ............... 216/67 |
| 5,740,009 A | * | 4/1998 | Pu et al. ....................... 361/234 |
| 5,748,434 A | * | 5/1998 | Rossman et al. ............ 361/234 |
| 5,835,333 A | * | 11/1998 | Castro et al. ................ 361/234 |
| 5,865,896 A | * | 2/1999 | Nowak et al. ............ 118/723 I |
| 5,891,348 A | * | 4/1999 | Ye et al. ......................... 216/67 |
| 5,919,332 A | * | 7/1999 | Koshiishi et al. ........ 156/345.47 |
| 5,942,039 A | * | 8/1999 | Kholodenko et al. ..... 118/723 E |
| 6,024,826 A | | 2/2000 | Collins et al. |
| 6,039,836 A | * | 3/2000 | Dhindsa et al. ........... 156/345.1 |
| 6,074,488 A | * | 6/2000 | Roderrick et al. ........... 118/728 |
| 6,079,356 A | * | 6/2000 | Umotoy et al. .......... 118/723 E |
| 6,095,083 A | | 8/2000 | Rice et al. |

(List continued on next page.)

FOREIGN PATENT DOCUMENTS

| | | |
|---|---|---|
| EP | 0 867 913 A1 | 9/1998 |
| WO | 99/14788 | 3/1999 |
| WO | 99/14796 | 3/1999 |

OTHER PUBLICATIONS

James F. Shackelford, "Material Scienec for Engineers", 3$^{rd}$. Ed., 1992, Macmillan Inc.*

(List continued on next page.)

*Primary Examiner*—Jeffrie R. Lund
*Assistant Examiner*—Rudy Zervigon
(74) *Attorney, Agent, or Firm*—Robert J. Stern

(57) ABSTRACT

A plasma chamber apparatus and method having a process kit capable of reducing or eliminating electrical arcing from exposed metal at the perimeter of a workpiece. The plasma chamber includes a cathode electrode adjacent the workpiece. A process kit encircles the perimeter of the workpiece. The process kit includes a dielectric shield and an electrically conductive collar that overlies the dielectric shield. The resistivity of the conductive collar is 0.1 ohm-cm or less.

30 Claims, 3 Drawing Sheets

U.S. PATENT DOCUMENTS

| | | | | |
|---|---|---|---|---|
| 6,143,144 A | * | 11/2000 | Golovato et al. | 204/192.33 |
| 6,165,311 A | | 12/2000 | Collins et al. | |
| 6,210,486 B1 | * | 4/2001 | Mizukami et al. | 118/728 |
| 6,238,588 B1 | | 5/2001 | Collins et al. | |
| 6,245,190 B1 | | 6/2001 | Masuda et al. | |
| 6,277,237 B1 | * | 8/2001 | Schoepp et al. | 156/345.1 |
| 6,284,093 B1 | | 9/2001 | Ke et al. | |
| 6,328,808 B1 | * | 11/2001 | Tsai et al. | 118/729 |
| 6,344,105 B1 | * | 2/2002 | Daugherty et al. | 156/345.51 |
| 6,364,957 B1 | * | 4/2002 | Schneider et al. | 118/728 |
| 2002/0029745 A1 | * | 3/2002 | Nagaiwa et al. | 118/723 E |

OTHER PUBLICATIONS

H. Shan et al.; "Process kit and wafer temperature effects on dielectric etch rate and uniformity of electrostatic chuck"; J. Vac. Sci. Tech. B, vol. 14, No. 1; Jan./Feb. 1996; pp. 521–526; USA.

H. Shan et al.; "Process kit and wafer temperature effects on dielectric etch rate and uniformity of electrostatic chuck;" Third International Workshop on Advanced Plasma Tools: Sources, Process Control and Diagnostics; May 4, 1995; San Jose, CA, USA.

Search report mailed Oct. 11, 2002 for PCT patent application No. PCT/US 02/03818.

* cited by examiner

CONDUCTIVE COLLAR SURROUNDING SEMICONDUCTOR WORKPIECE IN PLASMA CHAMBER

FIELD OF THE INVENTION

The invention relates to an electrically conductive collar or ring surrounding a workpiece in a plasma chamber used for semiconductor fabrication.

BACKGROUND OF THE INVENTION

Various semiconductor fabrication processes, such as plasma-assisted etching or chemical vapor deposition, are performed in plasma process chambers. A workpiece support member or pedestal supports a semiconductor workpiece or substrate at a processing position within the chamber. A plasma containing one or more reagents is maintained within the chamber, adjacent the workpiece position, so as to perform the desired semiconductor fabrication process.

The process chamber includes a cathode electrode adjacent the workpiece that is capacitively coupled to a radio frequency (RF) power supply so as to produce on the electrode a negative DC bias voltage relative to the plasma body. The bias voltage attracts ions to bombard the workpiece so as to promote the desired fabrication process. The RF power helps supply the excitation required to maintain the plasma.

The chuck for holding the workpiece on the workpiece support member may be a mechanical clamp such as a clamp ring. More commonly the chuck is an electrostatic chuck having a chuck electrode to which a chucking voltage is applied. A dielectric surrounds the chuck electrode to electrically insulate it from the workpiece and from any metal portions of the pedestal.

The RF power supply can be connected to the chuck electrode, to a metal body portion of the pedestal, or both. Whichever of these components are connected to the RF power supply function as the cathode electrode of the process chamber.

If the workpiece has exposed metal near its perimeter, and if there is a large electrical field at the location of the exposed metal, electrical arcing sometimes can occur between the exposed metal and either the chuck electrode or the metal pedestal body. Arcing is highly undesirable because the resulting current and heat can damage the electrical components on the workpiece. Factors that increase the likelihood of arcing include a high DC bias voltage on the cathode, a high chucking voltage, and the use of a magnetic field to enhance the plasma density within the chamber.

SUMMARY OF THE INVENTION

The invention is a plasma chamber apparatus and method capable of reducing or eliminating electrical arcing from exposed metal at the perimeter of a workpiece. The plasma chamber includes a cathode electrode adjacent the workpiece. A dielectric shield encircles the perimeter of the workpiece. An electrically conductive collar also encircles the perimeter of the workpiece and overlies the dielectric.

In another aspect, the invention is a process kit comprising the aforesaid dielectric shield and conductive collar.

We discovered that the conductive collar functions to substantially reduce or eliminate arcing if the collar has sufficiently low resistivity. The resistivity should be 0.1 ohm-cm or less, preferably 0.03 ohm-cm or less.

The conductive collar of the invention advantageously reduces or eliminates the risk of arcing from exposed metal at the perimeter of a workpiece.

In comparison with process kits not having a dielectric shield, our dielectric shield advantageously concentrates more RF power at the workpiece by attenuating the RF power outside the perimeter of the workpiece. In addition, in process kit designs having an elevated collar that functions as a focus ring, the dielectric shield can reduce erosion of the process kit by attenuating the RF power through the process kit.

DETAILED DESCRIPTION OF THE PREFERRED EMBODIMENTS

1. Conventional Components of Process Chamber

Figure 1:
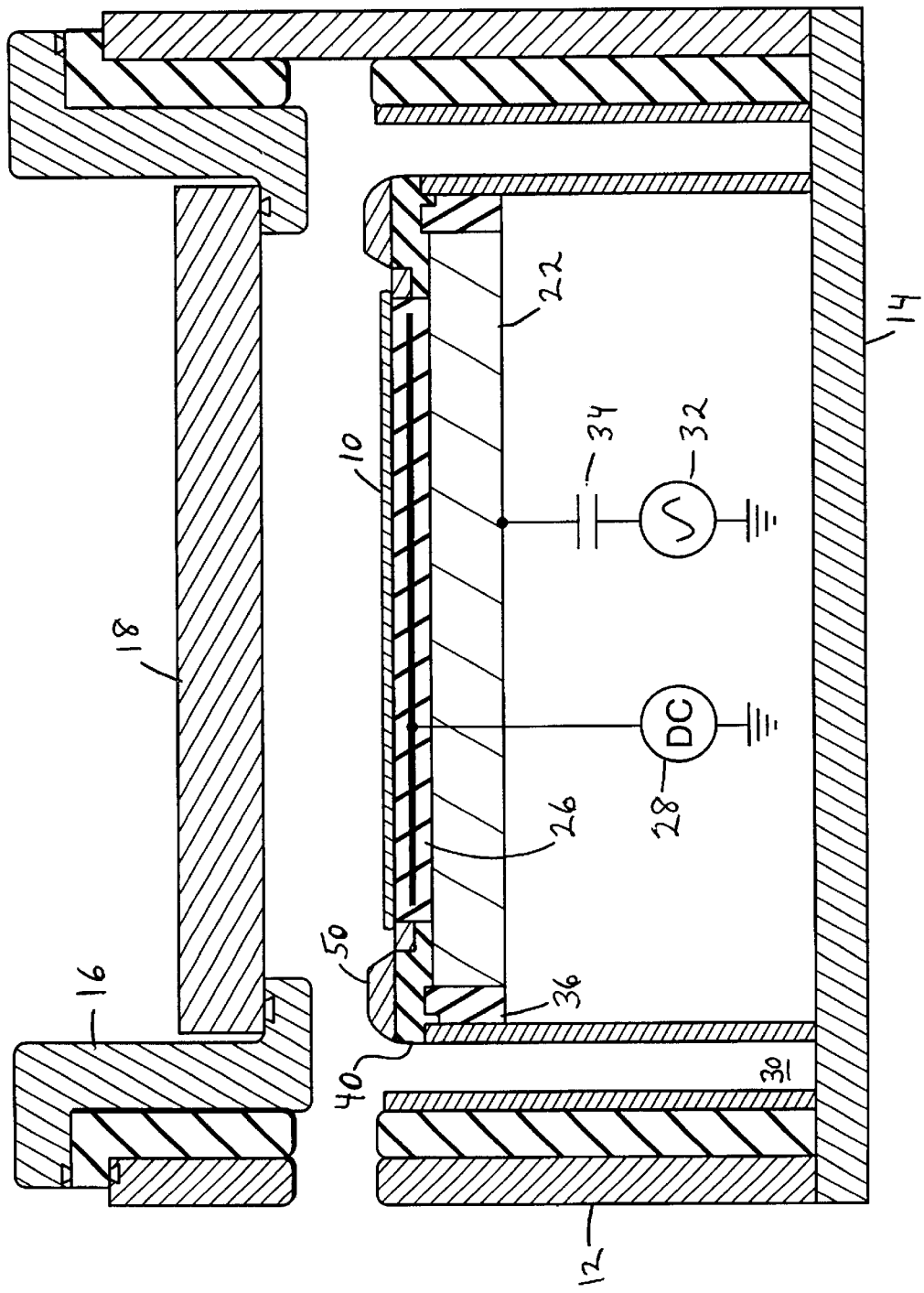
FIG. 1 is a schematic longitudinal sectional view of a plasma chamber according to the invention.

FIG. 1 shows a typical semiconductor fabrication process chamber in which the present invention can be used. The illustrated chamber is a magnetically-enhanced plasma chamber suitable for either etching or chemical vapor deposition (CVD). The conventional components of the chamber will be described before describing the conductive collar of the invention.

The process chamber is a vacuum chamber enclosed by cylindrical side wall 12, circular bottom wall 14, and circular top wall or lid 16. An anode electrode 18 is mounted at the bottom of the lid 16 and typically is electrically grounded. The anode electrode may be perforated to function as a gas inlet through which process gases enter the chamber. Each of the chamber walls 12–16 typically is metal, although some or all of the walls can be semiconductor or dielectric. Any walls that are not dielectric typically are electrically grounded and function as part of the anode.

The workpiece or substrate 10, such as a semiconductor wafer, is mounted on the substantially flat front surface of a workpiece support member or pedestal 20 (the "front" surface being the pedestal surface facing the anode). The pedestal typically is mounted on and supported by the bottom wall of the chamber. (The structure supporting the pedestal is not shown.) The pedestal typically has a metal body 22 that functions as a cathode electrode as described below, but the pedestal body need not be metal if another electrode, such as an electrode embedded in the electrostatic chuck dielectric, is connected as the cathode electrode.

Although the workpiece may be held in place on the pedestal by a mechanical clamp, such as a conventional clamp ring, more commonly the front portion of the pedestal includes a conventional electrostatic chuck 24, 26, which functions to securely hold the workpiece against the front surface of the pedestal. If the workpiece is a circular semiconductor wafer, the pedestal front surface is circular, and the pedestal and electrostatic chuck are cylindrical.

The electrostatic chuck includes at least one chuck electrode 24 and a dielectric 26 that surrounds the chuck electrode. The dielectric portion of the chuck electrically insulates the chuck electrode from the workpiece and from the metal pedestal body 22 behind the chuck.

The voltage for operating the electrostatic chuck is supplied by a "chuck" power supply 28. One output terminal of the chucking power supply is connected to the chuck electrode. The other output terminal typically is connected to electrical ground, but alternatively may be connected to a metal body portion of the pedestal. Typically the chucking power supply outputs a DC voltage, which can be of either polarity.

The perimeter of the chuck dielectric preferably is slightly smaller than the perimeter of the workpiece—i.e., the workpiece slightly overhangs the perimeter of the chuck dielectric—so that the chuck dielectric will remain completely covered by the workpiece even if the workpiece is misaligned slightly off center when it is positioned on the chuck. Assuring that the workpiece completely covers the chuck dielectric ensures that the workpiece shields the chuck from exposure to potentially corrosive or damaging substances in the environment of the workpiece fabrication process. For example, in the preferred embodiment the workpiece is a 200 mm silicon wafer, and the chuck dielectric has a 197 mm diameter, so that the wafer can be misaligned by up to 1.5 mm without exposing any of the chuck dielectric.

The portion of the pedestal below the electrostatic chuck typically includes a cylindrical body 22 composed of metal, such as anodized aluminum. The pedestal body typically has a greater radius than the electrostatic chuck simply to provide a flange to facilitate bolting the pedestal body to the chamber bottom wall or some other part of the chamber structure. In the illustrated embodiment the anodized aluminum pedestal had a radius 25 mm greater than that of the chuck.

A vacuum pump, not shown, exhausts gases from the process chamber through exhaust manifold 30 and maintains the total gas pressure in the chamber at a level low enough to facilitate creation of a plasma, typically in the range of 10 millitorr to 20 torr, with pressures at the lower and higher ends of the range being typical for etching and CVD processes, respectively.

During processing of a workpiece, a plasma is maintained in a region of the process chamber between the workpiece position 10 and the anode electrode 18. The plasma is created by exciting to a plasma state a process gas mixture comprising one or more reagent gases. It is conventional either to excite the plasma within the process chamber ("in situ plasma source"), or else to excite the plasma in another chamber ("remote plasma source") and pump the plasma into the process chamber.

A radio frequency (RF) power supply 32 is connected through one or more series coupling capacitors 34 to one or more of the following chamber components: the pedestal body 22, the chuck electrode 24, or an additional electrode (such as a wire mesh) embedded in the chuck dielectric 26. Whichever of these components are connected to the RF power supply collectively constitute the cathode electrode of the process chamber. In many conventional implementations and in the illustrated preferred embodiment, the metal pedestal body is connected to the RF power supply so as to function as the cathode electrode.

The RF power supply provides an RF voltage between the cathode electrode and the grounded anode electrode 18 which helps supply the excitation power required to maintain the plasma. The RF voltage applied to the cathode also produces a time-average negative DC bias voltage on the cathode electrode relative to both the anode electrode and the plasma body, which accelerates ionized process gas constituents toward the cathode electrode so as to bombard the workpiece.

2. Process Kit: Dielectric Shield and Protective Shield

Figure 2:
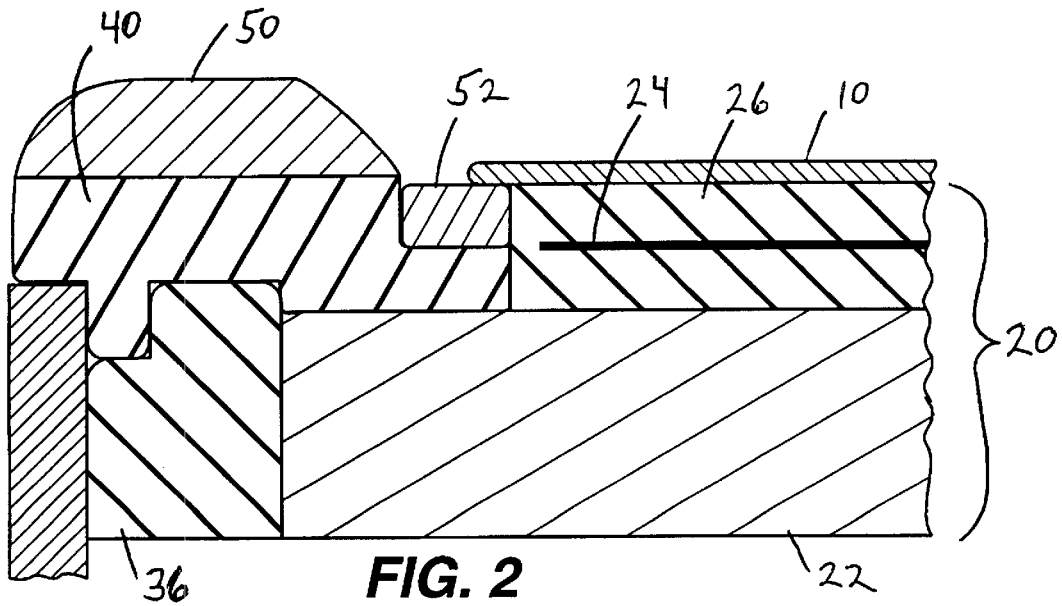
FIG. 2 is a sectional detail view of the dielectric shield and conductive collar of FIG. 1.

To maximize the concentration of reactive species and charged particles at the surface of the workpiece or substrate 10, and thereby maximize the reaction rate of the plasma-enhanced process being performed on the workpiece, the RF current flow between the plasma and the cathode electrode should be concentrated in the area occupied by the workpiece on the front surface of the pedestal 22. RF current flow through the front and side surfaces of the pedestal that are not covered by the workpiece represents wasted RF power because it does not directly contribute to the workpiece fabrication process. Therefore, it is conventional to cover such surfaces of the pedestal with dielectric to reduce RF current flow through those surfaces. FIG. 2 shows a dielectric cylinder 36 that covers the side surface of the cathode, and an annular dielectric shield or collar 40 that rests on and covers the top surface of the pedestal which is outside the perimeter of the wafer 10.

The axial or longitudinal thickness of the dielectric shield 40 preferably should be great enough to provide a substantial electrical impedance at the frequency of the RF power supply 32. More specifically, the impedance should be great enough to substantially attenuate the RF current density or RF power density through the shield in comparison with the current or power density that otherwise would be produced in the region occupied by the shield if the shield were absent. Accordingly, the dielectric shield preferably should be at least as thick as the workpiece—for example, at least 0.7 mm thick if the workpiece is a conventional silicon wafer. The axial contour of the dielectric shield 40 will be discussed below.

In many semiconductor workpiece fabrication processes, it is acceptable for the front surface (i.e., the surface facing the anode electrode) of the annular dielectric shield or collar 40 to be exposed to the plasma. However, such exposure is undesirable when the chamber is intended to perform processes for etching dielectric material on the workpiece. A dielectric etch process typically will etch a dielectric shield along with the dielectric on the workpiece, thereby eroding the shield so as to change its physical dimensions and therefore undesirably altering the conditions of the workpiece fabrication process. The release of chemical species eroded from the shield also can undesirably alter the chemistry of the workpiece fabrication process.

One conventional solution to this problem is to provide an annular erosion-resistant protective shield or collar 50, 52 overlying the dielectric shield. The protective shield should be composed of a non-dielectric material that is more resistant than the dielectric shield to erosion (e.g., due to chemical etching or sputter etching) by the environment of the workpiece fabrication process being performed in the process chamber. Since some erosion of the protective shield is unavoidable during the workpiece fabrication process, the material of the protective shield preferably should be one that will not contaminate the workpiece due to such erosion. In a chamber for performing processes for etching dielectric layers on a silicon substrate, the preferred material for the protective shield is silicon, since erosion of the silicon protective shield will not contaminate the silicon substrate.

When the workpiece is silicon, a metal protective ring generally is undesirable because even small amounts of metal can contaminate a silicon substrate.

In the preferred embodiment illustrated in FIGS. 1 and 2, the protective shield consists of two distinct components, a silicon top ring or outer ring 50 and a silicon inner ring 52. Because the inner ring is closer to the cathode electrode and to the plasma sheath, the inner ring generally erodes much faster than the outer ring. Implementing the protective shield as separate inner and outer rings enables replacing the inner ring without replacing the larger, and hence more expensive, outer ring.

The dielectric shield 40 and the protective shield 50, 52 in combination are referred to as a "process kit" because they are replaced periodically during the operation of the process chamber. The dielectric shield, overlying silicon protective ring, and all other process chamber components described above are described in greater detail in commonly owned U.S. patent application Ser. No. 09/665,484 filed Sep. 20, 2000 by Ke et al., the entire content of which is hereby incorporated by reference into this patent specification.

In most process chambers, including the illustrated preferred embodiments, the front surface of the process kit has an axial contour that is approximately coplanar with the workpiece adjacent the perimeter of the workpiece and that is axially elevated above (i.e., in front of) the plane of the workpiece at more radially outward positions. A process kit having an elevated portion encircling the workpiece perimeter is referred to as a "focus ring". In the embodiment shown in FIGS. 1 and 2, the silicon outer ring 50 is elevated above the plane of the workpiece, so it functions as a focus ring.

The primary function of the elevated focus ring is to improve the spatial uniformity of the workpiece fabrication process. More specifically, the elevated focus ring improves the azimuthal uniformity of the plasma and reagent distribution near the perimeter of the workpiece. In addition, the focus ring can be optimized to improve the radial uniformity of the workpiece fabrication process, i.e., to minimize differences between process performance near the perimeter of the workpiece and the center of the workpiece. Generally the dimensions of the focus ring which optimize process uniformity should be determined empirically.

In most processes, the predominant effect of the elevated focus ring is the "shadow" effect or "depletion" effect wherein the focus ring obstructs reactive species from travelling toward the perimeter of the workpiece. In the absence of a focus ring, the process rate tends to be higher near the perimeter of the workpiece. The height of the focus ring can be optimized so that the depletion effect increases the depletion of reactive species near the wafer perimeter to more closely match the depletion near the wafer center. Generally, increasing the depletion of active species near the wafer perimeter decreases the process rate near the perimeter. Secondly, the elevated focus ring produces a "confinement" or "residence time" effect in which it increases the residence time of reactive species near the perimeter of the wafer, which may either increase or decrease the process rate near the wafer perimeter, depending on the chemistry of the particular process being performed. Besides affecting the process rate, the "depletion" effect and the "residence time" effect affect other process performance parameters such as selectivity in an etch process or film quality in a deposition process.

Figure 3:
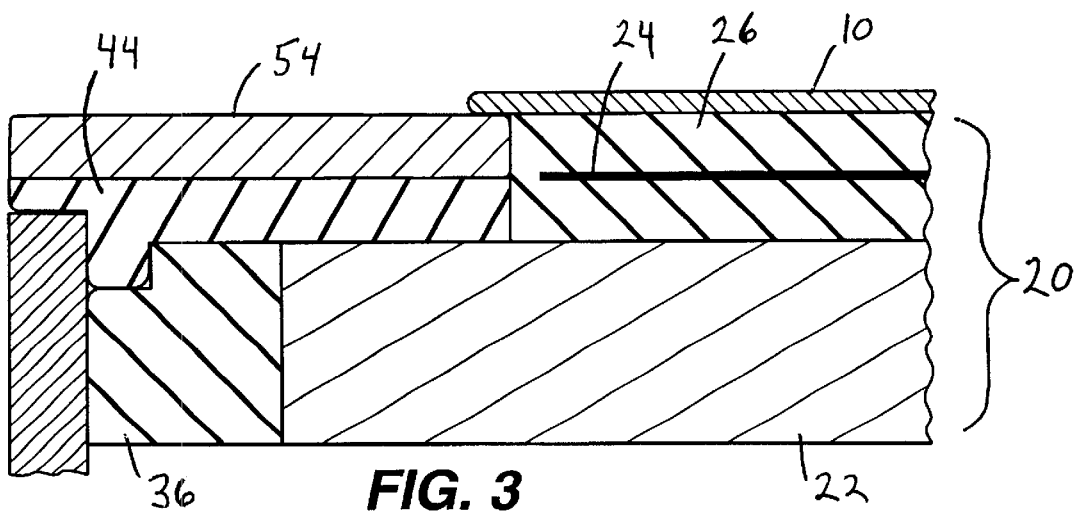
FIG. 3 is a sectional detail view of an alternative embodiment having a flat conductive collar that is not elevated above the plane of the wafer.

Thirdly, the elevated focus ring produces an "ion focusing" effect which increases the ion flux near the perimeter of the wafer because ions 34 accelerated downward from the plasma sheath collide with inwardly facing surface 32 of the elevated portion and ricochet 36 toward the wafer (see FIG. 3). The ion focusing effect is strongly dependent on the angle between the wafer surface and the face 32 of the elevated portion which faces the wafer, where a 135° angle (45° from vertical) would be expected to produce the greatest deflection of ions toward the center of the wafer. A fourth effect of the elevated focus ring is to displace axially upward the plasma sheath outside the workpiece perimeter, thereby moving the plasma sheath further from the workpiece perimeter, and consequently reducing the reactive species concentration near the perimeter of the workpiece.

The depletion effect, residence time effect, focusing effect, and plasma displacement effect all tend to be more pronounced as the height H is increased. All of these effects also are affected by the radial gap between the inward face 32 of the elevated portion and the perimeter of the wafer. The focusing effect is expected to be maximized at a certain gap (which must be empirically determined), whereas the other three effects progressively decrease with increasing gap.

Focus ring design considerations are discussed in detail in the above-referenced U.S. patent application Ser. No. 09/665,484.

3. Conductive Collar Overlying Dielectric Shield

If the workpiece or substrate 10 has exposed metal near its perimeter, and if there is a large electrical field at the location of the exposed metal, electrical arcing sometimes can occur between the exposed metal and either the process kit or the chuck electrode.

In fabricating semiconductor devices, it is conventional to specify that no material should be deposited on the workpiece closer than a certain distance from the edge of the workpiece, this distance being referred to as the "edge exclusion". For 200 mm diameter silicon wafers, the edge exclusion typically is 3 mm to 5 mm. The primary purpose of requiring an edge exclusion is to avoid the release of particles when robots grasp the edge of the workpiece.

Although metal normally should not be exposed at the edge of a workpiece, such exposure can occur due to alignment errors when successive layers are deposited onto and etched from the workpiece. If a metal feature extends slightly into the edge exclusion zone due to alignment errors, it may not be completely covered by subsequent layers of dielectric or resist, as a result of misalignment of those subsequent layers or poor control of the edge resist removal process.

Arcing is highly undesirable because the resulting current and heat can damage the electrical components on the workpiece, and because arcing produces many small particles that can contaminate the workpiece. Factors that increase the likelihood of arcing include a high DC bias voltage on the cathode electrode, a high chucking voltage, and the use of a magnetic field to enhance the plasma density within the chamber.

We believe the principal cause of the arcing is an electric field having a strong radial component near the perimeter of the workpiece. We believe this radial electric field is produced by a combination of the RF voltage between the cathode and ground, the cathode DC bias voltage, and the chucking voltage.

In our invention, the risk of arcing is dramatically reduced or eliminated by a highly conductive collar that overlies the conventional dielectric shield 40 and closely surrounds the perimeter of the workpiece. Preferably, there is as little gap as possible, or zero gap, between the conductive collar and the perimeter of the workpiece. This is accomplished if the conductive collar has an inner radius (or radially inner boundary) smaller than equal to the outer radius (or perimeter) of the workpiece, so that the perimeter of the workpiece touches or overlaps the radially inner portion of the conductive collar.

In the preferred embodiment, the conductive collar simply replaces the previously described erosion-resistant protective collar 50, 52. Specifically, the preferred conductive collar 50, 52 shown in FIGS. 1 and 2 is identical to a conventional protective collar 50, 52, except that the material of the conductive collar has a resistivity less than or equal to 0.1 ohm-cm, and preferably less than or equal to 0.03 ohm-cm.

The conductive collar can be fabricated of any material having the required low resistivity. For example, the conductive collar can be composed of metal, doped semiconductor, doped ceramic, or conductive ceramic such as certain metal oxides. Preferably, the material chosen for the conductive collar also should have the other properties described above as being desirable in a protective shield, namely: (1) resistance to erosion by the environment of the workpiece fabrication process, and (2) not releasing substances that will contaminate the workpiece as the conductive collar is eroded.

It was explained above that silicon fulfills these two criteria for use as a protective shield in a plasma chamber for etching dielectric films on silicon wafers. For the same reasons, silicon also is preferred for use as the conductive collar 50, 52 of our invention. However, our invention requires the use of silicon having a much lower resistivity than the silicon in a conventional erosion-resistant protective shield. This can be accomplished by doping the silicon with any N-type or P-type dopant conventionally used for increasing the conductivity of silicon. The dopant concentration in the silicon must be great enough so that the doped silicon has a resistivity of 0.1 ohm-cm or less.

We expect that silicon carbide also would satisfy the above stated criteria for use as the material of the conductive collar if it is doped sufficiently to lower its resistivity to the required level of 0.1 ohm-cm or less.

While our invention is not limited to such theory, we believe the mechanism by which the conductive collar prevents arcing is as follows. Because of its high conductivity, the conductive collar imposes a substantially equal electrical potential across its entire surface. This has at least two benefits in reducing the radial electric field adjacent the edge of the workpiece. First, over the distance that the collar extends radially outward from the workpiece perimeter, the electric field is close to zero at the surface of the collar. Second, since the collar surrounds the workpiece and imposes a substantially equal electrical potential around the circumference of the workpiece, electric fields along the plane of the workpiece are reduced.

In comparison with conventional designs that lack a dielectric shield, our invention has the advantage of concentrating more RF power at the workpiece by attenuating the RF power outside the perimeter of the workpiece. In addition, in process kit designs having an elevated collar that functions as a focus ring, the dielectric shield can reduce erosion of the process kit by attenuating the RF power through the process kit.

4. Comparison Tests

We compared the embodiment of the invention shown in FIGS. 1 and 2 with process kits using other materials for the outer collar or ring 50 and the inner collar or ring 52. Specifically, we tested for arcing while performing a conventional magnetically-enhanced, plasma-assisted process for etching silicon oxide and silicon nitride dielectric layers to create openings for pads on a 200 mm diameter silicon wafer. The wafers used for testing had patterned metal features below the dielectric layers. The wafers were obtained from two different production lots; the wafers from the second lot had a greater tendency to provoke arcing than those from the first lot.

We detected arcing by several methods: visually inspecting the wafers after processing, visually monitoring flashes of light in the chamber, and continuously monitoring the cathode DC bias voltage, the chucking voltage, and the reflected power between the RF power supply and the cathode. We interpreted a spike in any of the monitored values as evidence of arcing.

EXAMPLE 1: The conductive outer collar 50 and inner collar 52 were composed of silicon doped with a boron concentration such that the resistivity of the doped silicon was in the range of 0.008 to 0.012 ohm-cm. We observed no arcing whatsoever. The results were independent of whether the doped silicon was single crystal silicon or polysilicon.

Control 1: For comparison, we substituted a conventional outer collar 50 and inner collar 52 having dimensions identical to the conductive rings described in the preceding paragraph, but composed of lightly doped silicon having a resistivity of about 2 ohm-cm. Using an etch process and test wafers identical to those used to test the invention, we detected numerous instances of arcing and observed damage to the test wafers from both lots.

Control 2: We also compared an otherwise identical outer collar 50 and inner collar 52 composed of silicon carbide having a very high resistivity of $10^5$ ohm-cm. We detected numerous instances of arcing and observed damage to the test wafers from both lots.

EXAMPLE 2: The conductive inner collar 52 tested in Example 1 had an axial thickness of 3.6 mm. As Example 2 we substituted a conductive inner collar 52 having a thickness of 1.8 mm, half the thickness of the inner collar of Example 1. We increased the thickness of the portion of the dielectric shield below the inner collar by 1.8 mm so that that process kit occupied the same space as in Example 1. The thinner collar 52 of Example 2 performed as well as the thicker collar of Example 1; that is, we detected no instances of arcing. Therefore, we do not believe there would be any performance benefit in using a collar having any greater axial thickness than those tested. The primary advantages of a thicker collar are that it can withstand more erosion before it must be replaced, and it is less fragile so as to be less susceptible to accidental damage during manual handling by personnel.

EXAMPLE 3: FIG. 3 shows an alternative embodiment of the invention in which the conductive collar 54 is simply a flat annulus having an outer diameter equal to the outer diameter of the dielectric shield 44. The upper surface of the conductive collar is coplanar with the lower surface of the wafer 10, so that there is no focus ring extending above (in front of) the plane of the workpiece. The dielectric shield 44 has a flat upper surface to match the flat lower surface of the conductive collar 54. Under the same test conditions, the embodiment of Example 3 performed as well as the embodiments of Examples 1 and 2; that is, we detected no arcing whatsoever. This demonstrates that having an elevated focus ring is not important to achieving the arcing reduction benefits of the invention.

Figure 4:
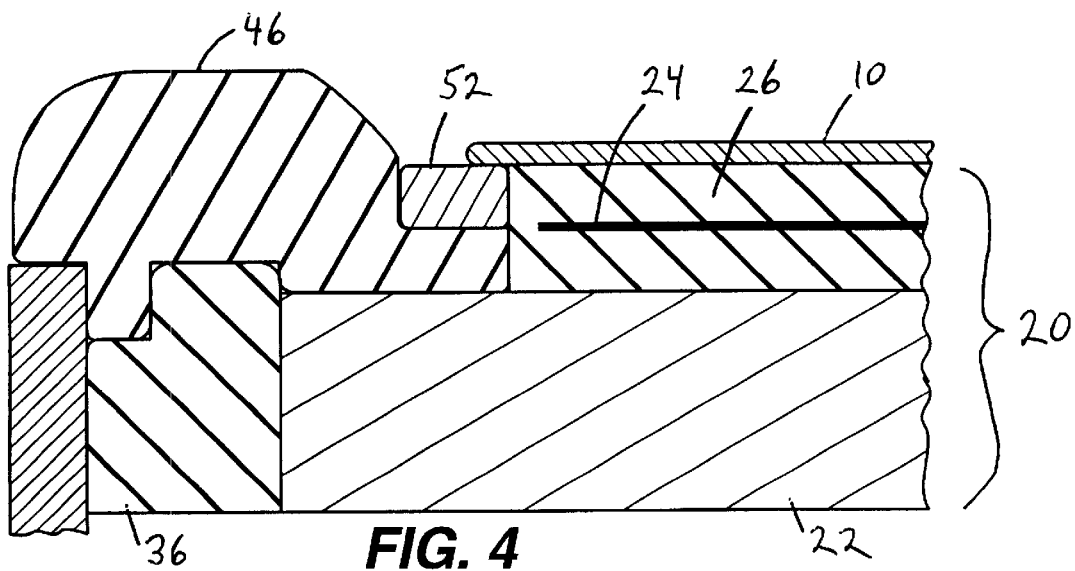
FIG. 4 is a sectional detail view of an alternative embodiment having a conductive collar that does not cover the elevated portion of the dielectric shield.

EXAMPLE 4: FIG. 4 shows an alternative embodiment of the invention that includes the conductive inner collar 52 but not the conductive outer collar 50. In our tests, the size of the dielectric shield 46 in this embodiment was the same as the combined size of the dielectric shield 40 and outer collar 52 in the FIG. 2 embodiment. The conductive inner collar 52 was identical to the one used to test the FIG. 2 embodiment. Under the same test conditions, we detected some arcing, but much less than with Control 1 and Control 2. Specifically, the wafers from the first lot exhibited no arcing damage whatsoever, but we did detect spikes in the voltages being monitored that indicated a potential for arcing. The wafers from the second lot did exhibit arcing damage.

The fact that Examples 1, 2 and 3 performed better than Example 4 indicates a conductive collar 50, 52, 54 that is too small in total radial width will not achieve the best suppression of arcing. In Examples 1, 2 and 4, the inner conductive collar 52 had a radial width of 5.7 mm (104 mm outer radius minus 98.2 mm inner radius), of which 4 mm extended radially beyond (i.e., outside) the perimeter of the wafer and 1.7 mm was behind (i.e., below) the wafer; the 100 mm radius wafer overhangs the perimeter of the electrostatic chuck by 1.7 mm. The outer conductive collar 50 in Example 1 and the flat conductive collar 54 in Example 3 had an outer radius of 134 mm, so that the conductive collar in Examples 1 and 2 had a total radial width extending 34 mm beyond the perimeter of the 100 mm radius wafer.

We believe the radial width beyond the perimeter of the wafer is the most important dimension of the conductive collar. These tests indicate that the arcing suppression performance of the conductive collar will be better if the collar extends at least 4 mm beyond the perimeter of the wafer as in the FIG. 3 embodiment, and preferably at least 8 mm. The arcing suppression was perfect when the collar extended at least 34 mm beyond the perimeter of the wafer as in the FIG. 2 embodiment.

Other properties of the components used in the foregoing tests were as follows. The conductive outer collar 50 had an elevation of 6 mm above (in front of) the plane of the wafer. The electrostatic chuck dielectric 26 was aluminum nitride, 10 mm thick. The dielectric shield was quartz with a thickness of 6.3 mm below the inner collar 52 and a thickness of 11.4 mm below the outer collar 50.

The conditions of the etch process used in the foregoing tests were as follows. The RF power supplied by the power supply 32 was 1500 watts at a frequency of 13.56 MHz, which produced a DC bias on the pedestal body 22 of −1500 volts relative to the grounded chamber walls. The chuck power supply 28 supplied −800 volts to the chuck electrode 24 relative to ground.

The chamber pressure was 150 millitorr, and the flow rates of the etch process gases were 50 sccm $CF_4$, 30 sccm $CHF_3$, 10 sccm $SF_6$, 10 sccm $N_2$, and 100 sccm Ar.

5. Additional Embodiments

Figure 5:
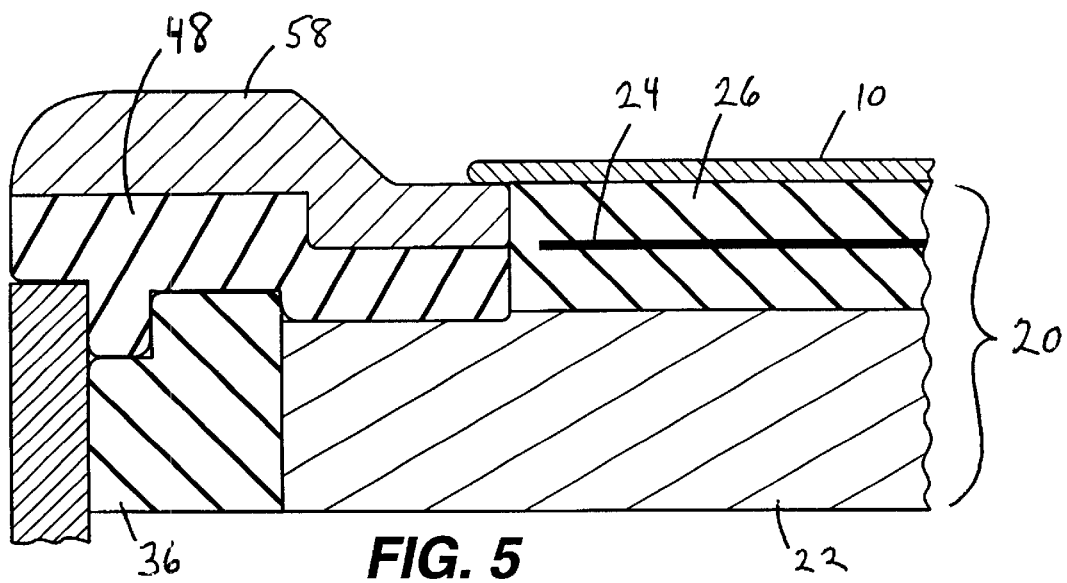
FIG. 5 is a sectional detail view of an alternative embodiment having a one-piece conductive collar.

FIG. 5 shows an alternative embodiment of the invention using a unitary conductive collar 56 in place of separate outer and inner collars 50 and 52. Dielectric 48 is similar to the dielectric 40 in FIG. 2, except that the inner diameter of the upper portion is greater to accommodate the unitary conductive collar. We expect this embodiment should perform similarly to the embodiment of FIGS. 1 and 2.

We expect that any dopant conventionally used for increasing the conductivity of silicon can be substituted for the boron dopant used in our tests. As stated above, we expect that the conductive collar 50, 52, 54, 56 can be composed of any material, including semiconductors and metals, having the required resistivity of 0.1 ohm-cm or less, and preferably 0.03 ohm-cm or less.

Although the invention has been described with directional language such as "above" and "below", these terms are intended to describe only the relative positions of the components, not their orientation relative to the earth's gravitational field. The invention is equally useful with other component orientations such as would be used for processing workpieces in a downward facing or side facing orientation.

What is claimed is:

1. A plasma chamber for performing a semiconductor fabrication process on a workpiece, comprising:

an electrode having a front surface facing an interior region of the chamber;

a workpiece support member for holding the workpiece so that the workpiece occupies a workpiece area adjacent the front surface of the electrode;

a shield, composed of dielectric material, encircling the perimeter of the workpiece area; and a conductive collar, composed of a semiconductor material having a resistivity no greater than 0.1 ohm-cm, encircling the perimeter of the workpiece area and overlying at least a portion of the dielectric shield.

2. A chamber according to claim 1, wherein the conductive collar has a resistivity no greater than 0.03 ohm-cm.

3. A chamber according to claim 1, wherein the conductive collar has a resistivity in the range of 0.008 to 0.012 ohm-cm.

4. A chamber according to claim 1, wherein the said semiconductor material has a sufficient concentration of dopant so as to have a resistivity no greater than 0.1 ohm-cm.

5. A chamber according to claim 1, wherein the conductive collar is composed of doped silicon.

6. A chamber according to claim 1, wherein:

the workpiece support member includes a metal pedestal body, and the electrode is said metal pedestal body.

7. A chamber according to claim 1, wherein:

the workpiece support member includes an electrostatic chuck having a chuck electrode surrounded by a chuck dielectric, and the electrode is said chuck electrode.

8. A chamber according to claim 1, wherein:

the workpiece area is characterized by a perimeter;

the conductive collar has a radially inner boundary that is inside the perimeter of the workpiece area; and the conductive collar has a perimeter that is outside the perimeter of the workpiece area.

9. A chamber according to claim 1, wherein:

the workpiece area is characterized by a perimeter; and the conductive collar has an inner boundary substantially coincident with the perimeter of the workpiece area.

10. A chamber according to claim 1, wherein:

the dielectric shield has a front surface facing said interior region of the chamber; and the conductive collar completely covers the front surface of the dielectric shield.

11. A chamber according to claim 1, wherein:

the dielectric shield consists of a radially inner portion and a radially outer portion; and the conductive collar overlies the radially inner portion of the dielectric shield.

12. A chamber according to claim 1, wherein the conductive collar has a radial width of at least 5.7 mm.

13. A chamber according to claim 1, wherein the conductive collar extends at least 4 mm radially beyond the perimeter of the workpiece area.

14. A chamber according to claim 1, wherein the conductive collar extends at least 8 mm radially beyond the perimeter of the workpiece area.

15. A chamber according to claim 1, wherein the conductive collar has a thickness of at least 0.7 mm.

16. A chamber according to claim 1, wherein the conductive collar has a thickness of at least 1.8 mm.

17. A chamber according to claim 1, wherein the conductive collar is has a thickness great enough to impose a substantial impedance to RF current flow.

18. A process kit adapted for mounting adjacent a workpiece in a semiconductor fabrication process chamber, comprising:
   a shield, composed of dielectric material, encircling the perimeter of the workpiece; and
   a conductive collar, composed of a semiconductor material having a resistivity no greater than 0.1 ohm-cm, encircling the perimeter of the workpiece and overlying at least a portion of the dielectric shield.

19. A process kit according to claim 18, wherein the conductive collar has a resistivity no greater than 0.03 ohm-cm.

20. A process kit according to claim 18, wherein the conductive collar has a resistivity in the range of 0.008 to 0.012 ohm-cm.

21. A process kit according to claim 18, wherein said semiconductor material has a sufficient concentration of dopant so as to have a resistivity no greater than 0.1 ohm-cm.

22. A process kit according to claim 18, wherein the conductive collar is composed of doped silicon.

23. A process kit according to claim 18, wherein:
   the dielectric shield has a front surface facing the conductive collar; and
   the conductive collar completely covers the front surface of the dielectric shield.

24. A process kit according to claim 18, wherein:
   the dielectric shield consists of a radially inner portion and a radially outer portion; and
   the conductive collar overlies the radially inner portion of the dielectric shield.

25. A process kit according to claim 18, wherein the conductive collar has a radial width of at least 5.7 mm.

26. A process kit according to claim 18, wherein the conductive collar extends at least 4 mm radially beyond the perimeter of the workpiece area.

27. A process kit according to claim 18, wherein the conductive collar extends at least 8 mm radially beyond the perimeter of the workpiece area.

28. A process kit according to claim 18, wherein the conductive collar has a thickness of at least 0.7 mm.

29. A process kit according to claim 18, wherein the conductive collar has a thickness of at least 1.8 mm.

30. A process kit according to claim 18, wherein the conductive collar is has a thickness great enough to impose a substantial impedance to RF current flow.

* * * * *